(12) United States Patent
Krishnamoorthy et al.

(10) Patent No.: US 10,714,895 B2
(45) Date of Patent: *Jul. 14, 2020

(54) RAPIDLY TUNABLE SILICON MODULATED LASER

(71) Applicant: Axalume, Inc., Cayenne Creek Rd., CA (US)

(72) Inventors: Ashok V. Krishnamoorthy, San Diego, CA (US); Jock Bovington, La Mesa, CA (US); Xuezhe Zheng, San Diego, CA (US); Saman Saeedi, San Diego, CA (US)

(73) Assignee: Axalume, Inc., San Diego, CA (US)

( * ) Notice: Subject to any disclaimer, the term of this patent is extended or adjusted under 35 U.S.C. 154(b) by 119 days.

This patent is subject to a terminal disclaimer.

(21) Appl. No.: 16/039,082

(22) Filed: Jul. 18, 2018

(65) Prior Publication Data

US 2019/0027899 A1    Jan. 24, 2019

Related U.S. Application Data

(60) Provisional application No. 62/534,210, filed on Jul. 19, 2017, provisional application No. 62/534,211, filed on Jul. 19, 2017.

(51) Int. Cl.
| | |
|---|---|
| *H01S 5/14* | (2006.01) |
| *H01S 5/10* | (2006.01) |
| *H01S 5/02* | (2006.01) |
| *G02B 6/293* | (2006.01) |
| *G02F 1/225* | (2006.01) |

(Continued)

(52) U.S. Cl.
CPC .......... *H01S 5/1071* (2013.01); *G02B 6/2935* (2013.01); *G02F 1/2257* (2013.01); *H01S 5/021* (2013.01); *H01S 5/065* (2013.01); *H01S 5/142* (2013.01); *G02F 2203/70* (2013.01); *H01S 5/0085* (2013.01); *H01S 5/0287* (2013.01); *H01S 5/0612* (2013.01); *H01S 5/0654* (2013.01); *H01S 5/141* (2013.01)

(58) Field of Classification Search
CPC ...... H01S 5/1007; H01S 5/1071; H01S 5/142; H01S 3/101; H01S 3/105
See application file for complete search history.

(56) References Cited

U.S. PATENT DOCUMENTS 9,778,493 B1 * 10/2017 Krishnamoorthy ..... G02F 1/011
9,939,663 B2 *  4/2018 Luo ....................... G02F 1/011
(Continued)

*Primary Examiner* — Michael Carter
(74) *Attorney, Agent, or Firm* — Steven Stupp

(57) ABSTRACT

An optical source may include an optical gain chip that provides an optical signal and that is optically coupled to an SOI chip. The optical gain chip may include a reflective layer. Moreover, the SOI chip may include: a common optical waveguide, a splitter that splits the optical signal into optical signals, a first pair of resonators that are selectively optically coupled to the common optical waveguide and that are configured to perform modulation and filtering of the optical signals, and a first bus optical waveguide that is selectively optically coupled to the first pair of resonators. Furthermore, resonance wavelengths of the resonators may be offset from each other with a (e.g., fixed) separation approximately equal or corresponding to a modulation amplitude, and a reflectivity of the first pair of resonators may be approximately independent of the modulation.

20 Claims, 9 Drawing Sheets

(51) Int. Cl.
  *H01S 5/065*  (2006.01)
  *H01S 5/00*   (2006.01)
  *H01S 5/06*   (2006.01)
  *H01S 5/028*  (2006.01)

(56) References Cited

U.S. PATENT DOCUMENTS

2009/0122817 A1\* 5/2009 Sato .................. G02B 6/12007
  372/20
2017/0139237 A1\* 5/2017 Luo ......................... G02F 1/011

\* cited by examiner

RAPIDLY TUNABLE SILICON MODULATED LASER

CROSS REFERENCE TO RELATED APPLICATIONS

This application claims priority under 35 U.S.C. 119(e) to U.S. Provisional Application Ser. No. 62/534,210, entitled "Rapidly Tunable Silicon Modulated Laser," by Ashok V. Krishnamoorthy, Jock Bovington, Xuezhe Zheng and Saman Saeedi, filed on Jul. 19, 2017, and to U.S. Provisional Application Ser. No. 62/534,211, entitled "Single-Pass Ring-Modulated Laser," by Jock Bovington, Xuezhe Zheng, Saman Saeedi and Ashok V. Krishnamoorthy, filed on Jul. 19, 2017, the contents of both of which are herein incorporated by reference.

BACKGROUND

Field

The present disclosure relates to an optical source, such as an optical transmitter. More specifically, the present disclosure relates to a silicon modulated laser.

Related Art

Silicon photonics holds the promise of revolutionizing high-performance computing by removing communication bottlenecks. An efficient optical transmitter is an important component in a silicon-photonic link and usually includes an efficient waveguide-coupled laser combined with a high-speed optical modulator. The function of the optical transmitter is to generate light and convert high-speed electrical data signals into optical form. Typically, an optical transmitter has high efficiency, high speed, low power consumption, low optical loss, a high ON/OFF extinction ratio (ER), and compact size.

Researchers are investigating micro-ring-mirror-based silicon-assisted lasers and micro-ring-based silicon modulators. Ring-based filters and ring-based modulators usually use strong resonances, respectively, for filtering and modulation. Therefore, these components can often provide high wavelength selectivity, which is typically useful for external cavity lasers or optical modulators with a large ER. However, these components often require precise and dynamic tuning in order to align the resonance with the lasing cavity modes of the laser and the laser wavelength of the modulator. This tuning can consume a large amount of electrical power and may need large and complicated control circuits.

Some researchers have proposed techniques for reducing the tuning power and to simplify the transmitter by combing filtering and modulation functionality within the lasing cavity. This approach can enable a high-speed modulator that is integrated into the laser or lasing cavity and, thus, that has the benefits of a low-cost, simple, directly modulated laser without the disadvantages of electron-photon resonances and modulation-induced wavelength chirp.

Furthermore, it is often useful to have fast wavelength switching and tuning for optical switching applications. Often, it has only been possible to achieve fast tunable lasers by using external modulators. However, external modulators typically increase the loss and can have a modulation penalty in the range of 6-10 dB. In principle, these challenges can be addressed using a ring-modulated laser. However, while a dual ring-resonator modulated laser can be tuned by moving the ring resonances, the switching speed is usually on the order of microseconds, which may be too slow for many applications.

SUMMARY

One embodiment of the present disclosure provides an external cavity optical source. This optical source includes an optical gain chip that provides an optical signal and that is optically coupled to a silicon-on-insulator (SOI) chip. The optical gain chip includes a reflective layer at one end of the optical gain chip. This reflective layer may include a high-reflectivity (HR) coating or a distributed Bragg reflector. Moreover, the SOI chip includes: a common optical waveguide that conveys the optical signal, a splitter that splits the optical signal into optical signals (e.g., into clockwise and counter-clockwise propagating optical signals) that are conveyed on through optical waveguides, a first pair of resonators that are selectively optically coupled to the through optical waveguides and that perform modulation and filtering of the optical signals, and a first bus optical waveguide that is selectively optically coupled to the first pair of resonators (which may include, without loss of generality, a pair of ring resonators, racetrack resonators, disk resonators and/or resonator filter/modulators). Note that the splitter may include a Y-junction splitter, a directional coupler, a multimode-interference coupler, a photonic crystal splitter, etc. In addition, note that the reflective layer in the optical gain chip and the first pair of resonators defines a first optical cavity. Furthermore, during operation, resonance wavelengths of the resonators are offset from each other with a (e.g., fixed) separation approximately equal or corresponding to a modulation amplitude, and a reflectivity of the first pair of resonators is approximately independent of the modulation.

Note that the optical source may be free of phase-induced wavelength chirp or modulation fluctuations.

Moreover, the optical gain chip may include a reflective semiconductor optical amplifier.

Furthermore, the optical source may include a tuning circuit that thermally or electrically tunes the resonators.

Additionally, the optical source may use push-pull modulation of the resonators (with approximately the same modulation magnitude and with alternating and opposite signs on the resonators) to interchange positions of the resonance wavelengths during the modulation.

In some embodiments, the optical source includes a phase shifter in the optical gain chip, the SOI chip before the splitter, or both that tunes a lasing wavelength of the optical source Moreover, the lasing wavelength may be offset from the resonance wavelengths.

Note that the modulation of the resonators is symmetric so that, at a given time, a first of the resonator provides modulated light while a second of the resonators provides bias and compensates for reflectivity or phase changes.

Furthermore, the optical source may use push-push/pull-pull modulation of the resonators (with approximately the same modulation magnitudes and with the same alternating signs on the resonators), and the lasing wavelength may be approximately midway between the resonance wavelengths.

In some embodiments, the optical source includes a second pair of resonators (which may include, without loss of generality, a pair of ring resonators, racetrack resonators, disk resonators and/or resonator filter/modulators) and an associated second bus waveguide that is selectively optically coupled to the second pair of resonators, where the reflective layer in the optical gain chip and the second pair of resonators defines a second optical cavity. The first bus waveguide and the second bus waveguide may include phase tuners and variable optical attenuators. A given variable optical attenuator may selectively adjust loss in a given optical cavity to select a lasing wavelength of the optical source.

Note that the first or second bus (e.g., straight) optical waveguides may be replaced with a curved optical waveguide to achieve the necessary coupling to the pair of resonators. Alternatively, the resonators may have or may include embedded Bragg gratings to achieve the necessary feedback to the cavity.

Other embodiments provide an electronic device that includes the optical source.

Other embodiments provide a system that includes the optical source.

Other embodiments provide a method for providing an optical signal, which may be performed by an optical source, such as the optical source.

Other embodiments provide an external cavity optical source with dual bus optical waveguides selectively optically coupled to one or more pairs of resonators.

Other embodiments provide multiple optical sources selectively coupled to a common optical waveguide by resonators.

This Summary is provided merely for purposes of illustrating some exemplary embodiments, so as to provide a basic understanding of some aspects of the subject matter described herein. Accordingly, it will be appreciated that the above-described features are merely examples and should not be construed to narrow the scope or spirit of the subject matter described herein in any way. Other features, aspects, and advantages of the subject matter described herein will become apparent from the following Detailed Description, Figures, and Claims.

BRIEF DESCRIPTION OF THE FIGURES

Note that like reference numerals refer to corresponding parts throughout the drawings. Moreover, multiple instances of the same part are designated by a common prefix separated from an instance number by a dash.

DETAILED DESCRIPTION

Figure 1A:
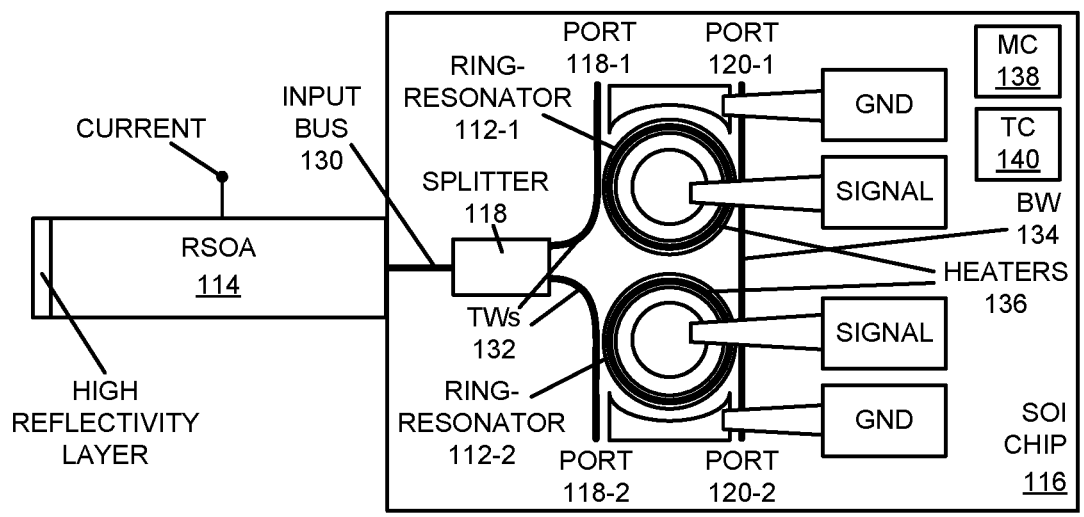
FIG. 1A is a drawing illustrating an example of a ring-modulated laser or a ring-resonator-modulated laser (RML) in accordance with an embodiment of the present disclosure.

An external cavity optical source (such as an RML) is described. This optical source may include an optical gain chip that provides an optical signal and that is optically coupled to an SOI chip. The optical gain chip may include a reflective layer at one end of the optical gain chip. Moreover, the SOI chip may include: a common optical waveguide, a splitter (such as an optical splitter) that splits the optical signal into clockwise and counter-clockwise propagating optical signals that are conveyed on through optical waveguides, a first pair of resonators that are selectively optically coupled to the through optical waveguides and that perform modulation and filtering of the optical signals, and a first bus optical waveguide that is selectively optically coupled to the first pair of resonators. Note that the reflective layer in the optical gain chip and the first pair of resonators may define a first optical cavity. Furthermore, resonance wavelengths of the resonators may be offset from each other with a (e.g., fixed) separation approximately equal or corresponding to a modulation amplitude, and a reflectivity of the first pair of resonators may be approximately independent of the modulation.

In general, the output of the optical source may be taken from the reflective layer in the optical gain chip or a reflectors or resonator mirrors in the SOI chip depending on where the light output is desired. For example, this can be accomplished by adjusting the relative reflectivity of the reflective layer and/or the pairs of reflectors.

The optical source may provide reduced or eliminated phase-induced wavelength chirp or modulation fluctuations. Moreover, the optical source may be rapidly tuned. Therefore, the optical source may provide improved performance for use in applications, such as in optical links that include the optical source, such as silicon-photonic links, optical fibers, etc.

We now describe embodiments of an optical technique. This optical technique may be used to provide a fast tunable (e.g., in the nanosecond range) dual resonator (such as ring resonators)-modulated laser (RML). Notably, the RML, may be a high-speed silicon-photonic device that combines a dual ring-resonator modulator with an external-cavity laser. In the RML (which is sometimes referred to as an 'optical source'), a dual ring-resonator modulated laser may be cascaded onto a common bus or optical waveguide using a common external or integrated gain medium. In addition, techniques for modulating the RML are disclosed. Notably, the RML may be a single component that combines: an efficient waveguide-coupled silicon-assisted laser; a high-speed modulator built into the laser and free of (or with reduced) phase-change induced wavelength chirp or other cavity-related modulation penalties; and rapid tunability of the wavelength of the laser (which is useful for optical switching and wavelength-based routing applications). In some embodiments, the RML includes dual redundancy and simultaneous multi-wavelength operation.

The integrated dual ring-resonator modulator in the lasing cavity may function as a filter and mirror, while also acting as a modulator. Moreover, by removing intra-cavity power variation in the lasing cavity (and, thus, by overcoming laser-cavity photon-lifetime limits, as well as circumventing round-trip cavity effects related to cavity phase variations), the disclosed RML can provide reduced or low-chirp and high-speed operation. Note that the speed may be enhanced by using small ring resonators with a large free-spectral range (FSR) and that are capable of high-speed modulation. For example, a ring resonator with radius of less than 5 μm can have an FSR greater than 20 nm and may be modulated beyond 60 Gb/s.

FIG. 1A presents a drawing illustrating an example of an RML 110. This RML may have a dual resonator configuration (e.g., with dual ring resonators 112, which are used as examples of dual resonators). A III-V or germanium optical gain chip (such as a reflective semiconductor optical amplifier or RSOA 114) may be coupled to a silicon-on-insulator (SOI) chip 116 via, e.g., edge coupling. Moreover, a splitter 118 (such as a Y-junction splitter, a directional coupler, a 1×2 multi-mode interference coupler, a photonic crystal splitter, etc.) can be used to split the light into clockwise and counter-clockwise propagating waves. However, other configurations may be used. For example, RSOA 114 may be surface-normal coupled to SOI chip 116 using grating couplers and/or a turning mirror.

Note that an optional phase shifter (not shown in FIG. 1A) in RSOA 114 and/or SOI chip 116 before splitter 118 and the Y-branch can be used to precisely tune the lasing-cavity mode with respect to the ring resonances. Coarse tuning to adjacent cavity modes can also be achieved with ring-resonator tuners by adding a constant bias to both ring resonators 112.

Figure 1B:
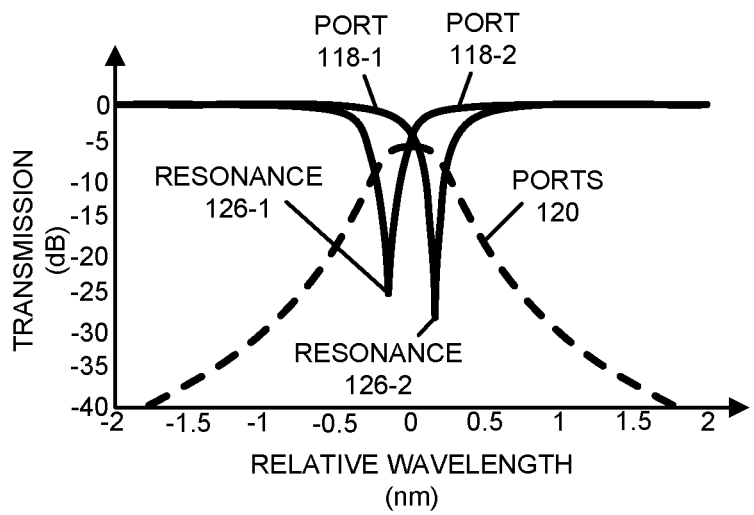
FIG. 1B is a drawing illustrating an example of transmission as a function of wavelength in accordance with an embodiment of the present disclosure.

FIG. 1B presents a drawing illustrating an example of transmission 122 as a function of wavelength 124 in RML 110 in FIG. 1A. Notably, FIG. 1B presents the through-port 118 transmission 122 for ring resonators 112 showing the resonance 126 dips offset. Also shown in FIG. 1B is the effective round-trip reflectivity of the two ring-resonator drop ports 120 created by offsetting resonances 126.

Thus, dual RML 110 (which are selectively optically coupled to through optical waveguides or TWs 132) can modulate the overall output transmission of each of ring resonators 112 onto bus waveguide (BW) 134 (which is sometimes referred to as a 'bus optical waveguide' or a 'drop optical waveguide') without significantly affecting the overall reflectivity of the dual ring-resonator 112 mirror. This may enable the modulation bandwidth of the laser output to approach the photon lifetime limit of ring resonators 112 without being limited by the laser-cavity lifetime.

Figure 2A:
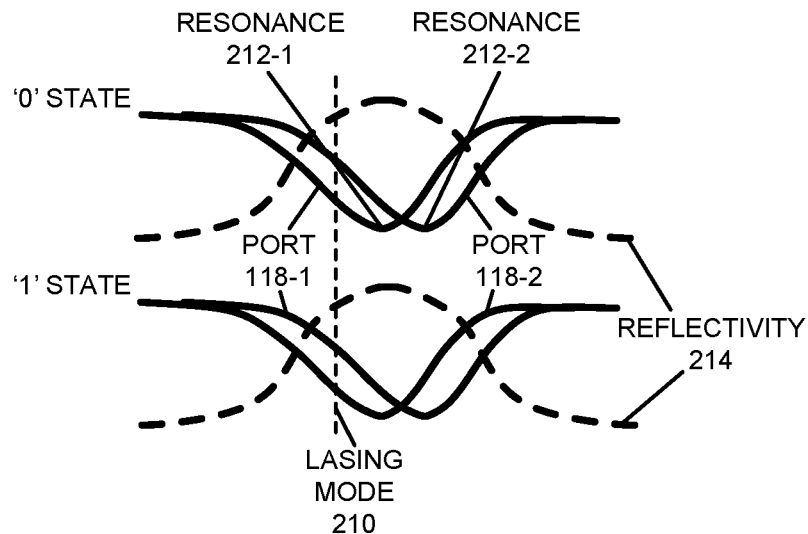
FIG. 2A is a drawing illustrating an example of operation of an RML in accordance with an embodiment of the present disclosure.

There may be, e.g., two techniques for operating dual RML 110. The first operating technique is shown in FIG. 2A, which presents an example of operation of RML 110 in FIG. 1A. Notably, the first operating technique may allow phase or path-length changes to be reduced or minimized in order to allow low-chirp or even chirp-free operation. In this first mode of operation, ring-resonator 112 modulators are tuned away from each other so as to position the (e.g., fixed) separation of resonances 212 to be equal to the intended modulation approximately equal to the intended modulation (such as within 1, 5, 10 or 25% of the intended modulation). Moreover, push-pull modulation may be used to interchange the position of the two resonance 212 dips, as seen on ports 118, so as to reduce or exactly cancel any overall accumulated reflectivity or phase differences in the cavity. Furthermore, lasing wavelength or mode 210 may be ideally positioned either to the left of resonance 212-1 as shown or to the right of resonance 212-2, so as to operate with high contrast and reasonable output power. Note that the position or location of lasing mode 210 may be slightly offset from the through-port 118 minima and the peak in reflectivity 214.

Referring back to FIG. 1A, in the first operating technique, ring-resonator 112-1 modulator may modulate clockwise circulating light present on its input bus 130 (which is sometimes referred to as a 'common optical waveguide') and ring-resonator modulator 112-2 effectively applies an equal and opposite phase change before returning its output to the gain section of the cavity (and vice-versa for anti-clockwise circulating light). Because the gain medium is not modulated, the modulation bandwidth may be independent of the current-injection-related laser resonance. Moreover, the lasing wavelength may be determined by the overlap of the dual-ring-resonator filter provided by ring resonators 112 with the cavity mode resonance. In some embodiments, an optional phase section (not shown) may be included to enable the lasing wavelength to be independently controlled and positioned to the optimal bias point of the ring-resonator 112 modulators in order to optimize modulation efficiency, while maintaining overall mirror reflectivity and phase-delay constant. Note that a small amount of tuning may be needed for each of ring resonators 112 in order to optimize the relative position of the ring resonances 126 (FIG. 1B) and the available modulation swing. Furthermore, dual RML 110 may enable a differential output with a high-contrast ratio. Notably, dual RML 110 may be symmetric, so that a given one of ring resonators 112 provides the modulated output while the other of ring resonators 112 provides the bias and compensates for reduced or minimum reflectivity and phase changes. This first push-pull operating technique may reduce or may completely eliminate the cavity fluctuation (both intensity and phase) in order to achieve a low-chirp, high-speed modulated laser. The tradeoff may be that the laser is biased off-center and, thus, the side-mode-suppression ratio can be limited, which may lead to laser mode-hopping. The suppression can be improved through the use of a shorter overall lasing cavity with a correspondingly larger mode spacing.

Figure 2B:
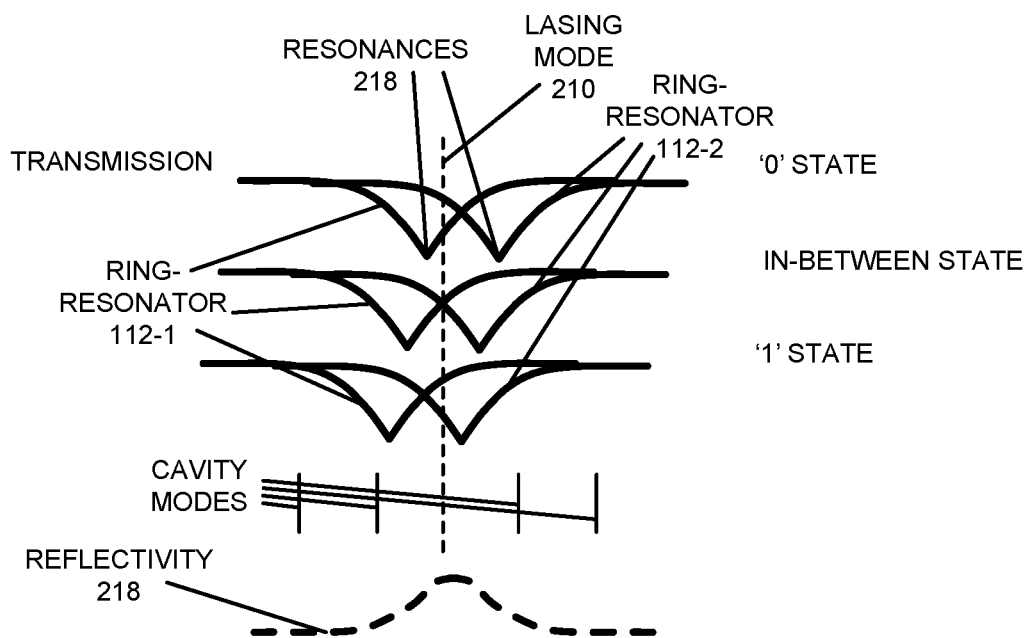
FIG. 2B is a drawing illustrating an example of operation of an RML in accordance with an embodiment of the present disclosure.

A second push-push/pull-pull operating technique is shown in FIG. 2B, which presents a drawing illustrating an example of operation of RML 110 in FIG. 1A. The second operating technique can be used to achieve differential outputs and constant reflectivity 218. In this second operating technique, both ring resonators 112 are modulated in a tandem (push-push/pull-pull) manner leaving resonance 216 dips and the overall reflectivity 218 approximately unchanged during modulation. (In the present disclosure 'approximately' should be understood to be with 1, 5, 10 or 25%.) This second operating technique may provide differential outputs in two separate optical waveguides. The lasing wavelength can be biased near or at the peak between the resonance 216 dips, which can improve suppression of side modes if high-quality-factor ring resonators are used for ring resonators 112. Moreover, a single driver can be used to modulate both ring resonators 112 (such as modulation circuit or MC 138), and thermal tuning (such as using heaters 136 and tuning circuit or TC 140) and/or electrical tuning can be used to bias ring resonators 112 relative to each other. Note that the second push-push operating technique may achieve reduced or minimum cavity-intensity fluctuation and may potentially improve side-mode suppression for the same cavity length. The tradeoff may be an associated phase-change induced chip, which can limit the modulation speed and can induce dispersion during optical-fiber data transmission.

Figure 3:
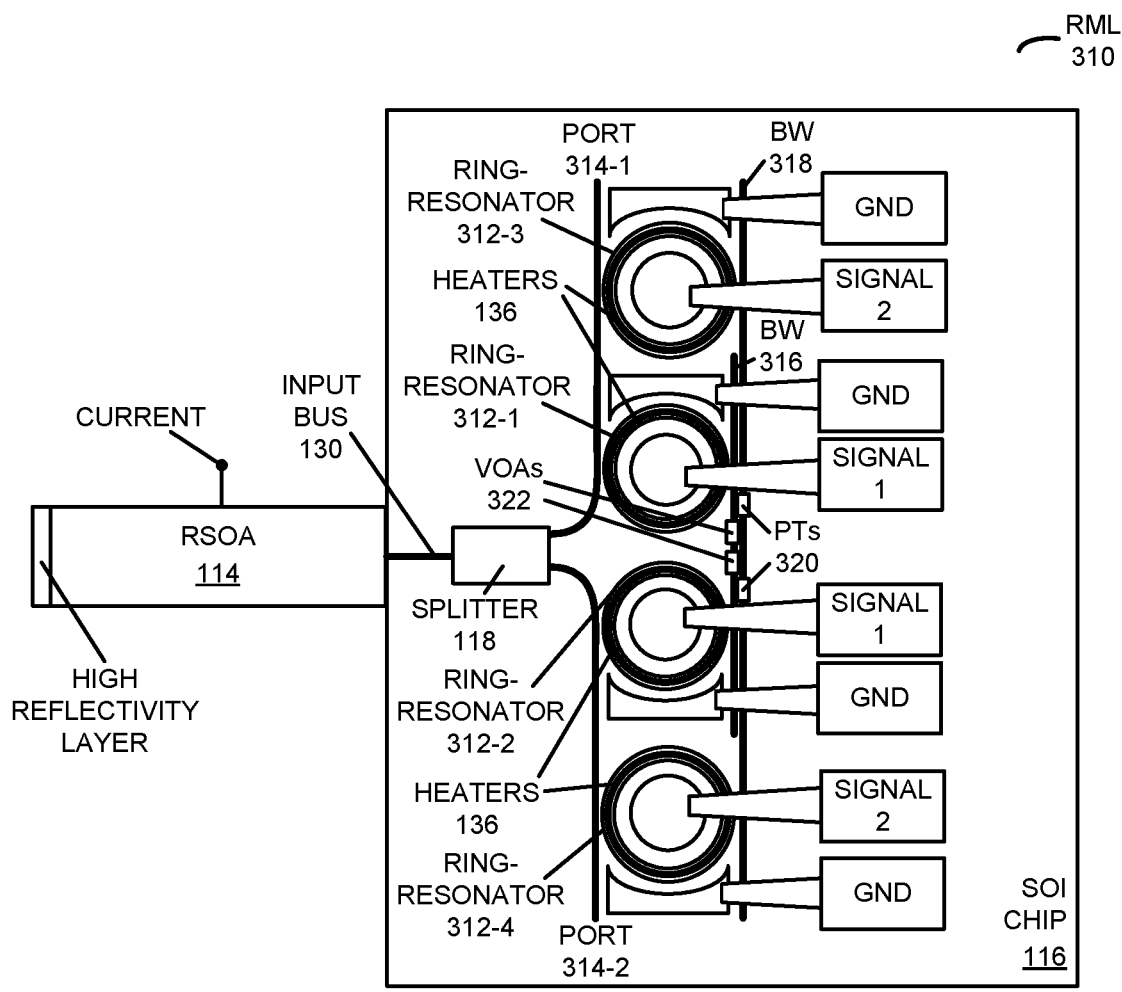
FIG. 3 is a drawing illustrating an example of an RML in accordance with an embodiment of the present disclosure.

FIG. 3 presents a drawing illustrating an example of an RML 310 with a cascaded series of dual-ring modulators 312 sharing a common gain medium and common differential output ports 314. In FIG. 3, a plurality of ring-resonator pairs (such as ring resonators 312-1 and 312-2 or ring resonators 312-3 and 312-4) may be cascaded along the two output ports 314 of dual RML 310. Each pair of ring resonators may have a bus waveguide (such as bus waveguide 316 or 318) to complete the optical cavity. This arrangement may provide a plurality of optical cavities, each with a dual-ring-modulator pair at which lasing can occur.

Moreover, a number of ring-resonator coupling conditions, arrangements or embodiments may be used. In some embodiments, a ring-resonator modulator (such as ring resonator 312-1) can be critically coupled to its corresponding output bus (and, thus, output port 314), with weaker coupling to the drop bus waveguide 316 shared by the modulator pair. Alternatively, symmetric coupling of each of ring resonators 312-1 and 312-2 to the output-port 314 bus and the shared drop bus waveguide 316 can be used. Note that individual phase adjustment per cavity may be included in each bus waveguide (such as bus waveguide 316 or 318) to adjust the position of lasing mode independently of the ring resonance of ring resonators 312. This optional phase tuner (such as one of phase tuners or PTs 320) may provide the ability to continuously tune across a fixed range versus the discrete (cavity-mode-selection) tuning than can be achieved by thermally tuning the ring-resonator 312 filters. Per the RML, architecture and operation techniques described previously, each cavity may be biased so as to support a single lasing mode. Furthermore, it may be possible to experience gain competition if multiple lasing modes in different cavities have similar loss. Therefore, each cavity may include an optional variable optical attenuator or VOA (such as one of VOAs 322) that is used to increase loss in a particular cavity and, thus, to quench lasing in a given cavity. Consequently, lasing can be switched from one cavity (lasing wavelength) to another at a speed dependent on the lasing cavity round trip and the response time of the corresponding one of VOAs 322. In principle, VOAs 322 can be set so that lasing is quenched near the threshold of the given lasing cavity. This may enable a fast-wavelength switched dual RML with a single modulated lasing wavelength active at a given time. This fast-tuning RML may respond as fast as VOAs 322 can be modulated, which may be, e.g., on the order of nanoseconds.

The architecture shown in FIG. 3 may be extended to more pairs of dual ring-resonator 312 modulators. Moreover, the resonances of each pair may be designed to be close to each other (e.g., within 0-200 μm), whereas the resonances of other lasing cavity pairs may be spaced further apart in order to reduce or minimize through loss and according to the desired spacing between switched wavelengths (e.g., in the range 0.8-8 nm). The physical arrangement or architecture of the dual ring-resonator 312 modulator pairs in FIG. 3 may also reduce or minimize the path-length difference and, thus, the cavity-mode spacing between the various cavities. These embodiments may also bring each pair of ring-resonator 312 modulators closer together, so that their resonance spread because of manufacturing variations is reduced or minimized.

In some embodiments, the techniques used in the described RML are extended to fast-tunable dual RMLs in which the resonators are rings, race-track rings, discs, or other resonant devices that can be coupled to the corresponding output waveguide and modulated at high-speed.

Figure 4:
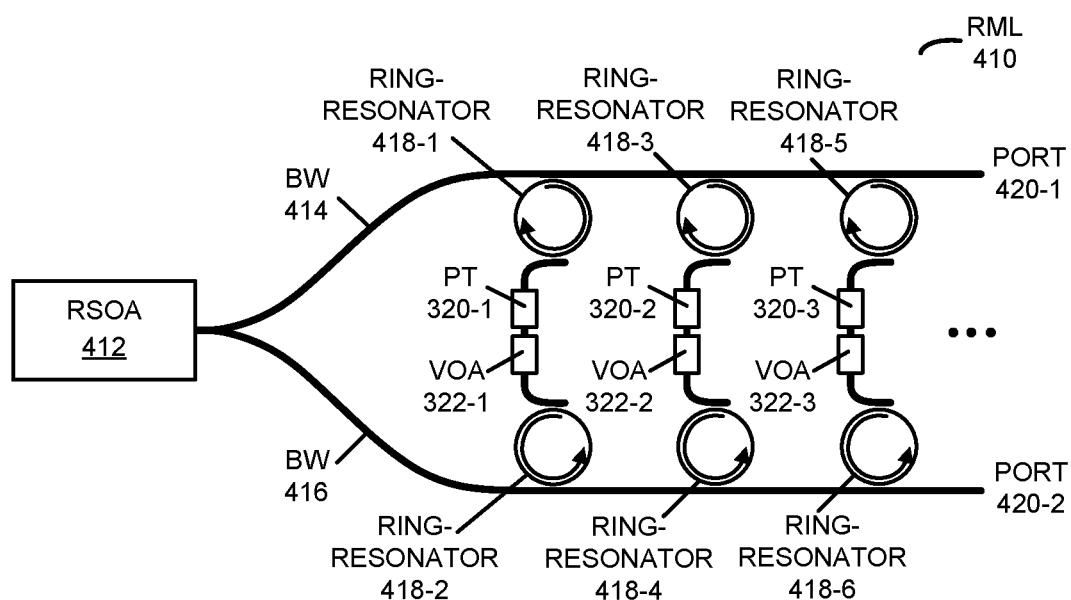
FIG. 4 is a drawing illustrating an example of an RML in accordance with an embodiment of the present disclosure.

Furthermore, as shown in FIG. 4, which presents a drawing illustrating an example of an RML 410, in some embodiments of the dual RML RSOA 412 feeds outputs to upper and lower bus waveguides 414 and 416. These embodiments may facilitate monolithic integration of gain into SOI photonic wafers, and may help reduce the cavity lengths of the laser, which may increase the cavity-mode spacing and may improve suppression of side modes by the respective ring-resonator 418 filters.

Notably, RML 410 has an alternate physical arrangement or architecture of the dual ring-resonator 418 modulator pairs that reduces or minimizes the path-length difference and, thus, the cavity-mode spacing between the various cavities. This RML may also bring each pair of ring-resonator 418 modulators closer together so that their resonance spread because of manufacturing variations is reduced or minimized. The lasing wavelength may be determined by the unquenched pair of modulators (in this case ring-resonant 418 modulators) that create the cavity in, e.g., an SOI chip. By modulating using VOAs 322, the effective cavity may be switched, which may cause the wavelength to switch. Note that the ring-resonant 418 modulators may provide data modulation to the given lasing wavelength. Moreover, note that the light in ring resonators 418-1, 418-3 and 418-5 may propagate in the opposite sense (clockwise) from the light in ring resonators 418-2, 418-4 and 418-6 (which may propagate counter clockwise), and that each pair of ring resonators (such as ring resonators 418-1 and 418-2) may have or correspond to the same or a different lasing wavelength. Furthermore, the given lasing wavelength may exit the hybrid cavity through top and bottom output ports 420, and light from both top and bottom outputs 420 may be optionally combined.

In some embodiments, if high-speed modulation is not desired, then lower loss, tunable ring resonators may be used in FIG. 4. In these embodiments, the left and right circulating modes of a given cavity are symmetric and coherent, and thus may be constructively combined at outputs 420 to create a single output port if desired (rather than two output ports 420 with power splitting). In this way, a rapidly tunable laser with individual wavelength adjustments on each pair of ring resonators 418 can be achieved with a single output. If the phase responses of the ring resonators 418 exhibit some distortion, then it may be necessary to add an optional phase element (not shown) to one of the paths to compensate for this distortion before combining them.

Figure 5:
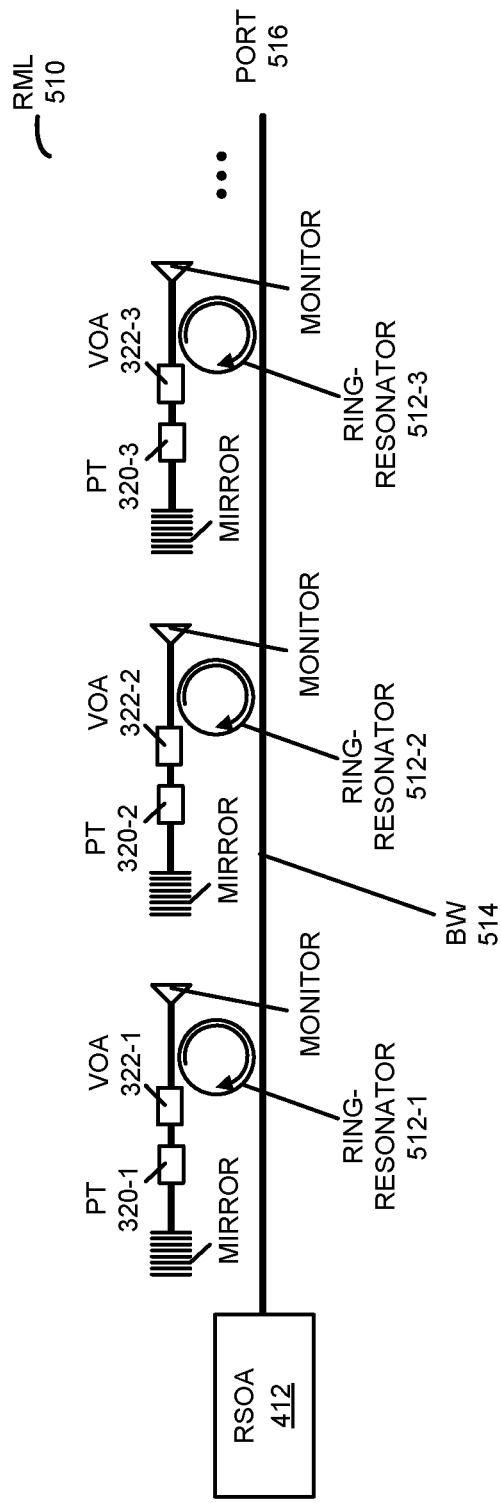
FIG. 5 is a drawing illustrating an example of an RML in accordance with an embodiment of the present disclosure.

While it may be beneficial to have a single output, rapidly tunable, and high-speed modulation capability in a single optical device, as shown in FIG. 5, which presents a drawing of an example of an RML 510, in some embodiments the optical technique is extended to use a cascaded array of single ring-resonator-modulated lasers with ring resonators 512. Note that the light in ring resonators 512 may propagate clockwise, and that each of ring resonators 512 may have or correspond to the same or a different lasing wavelength. While this embodiment may not have the advantage of chirp-free (or chirp-reduced) operation, it has a single-ended bus waveguide output port 516 (as opposed to a differential output of a dual RML), and thus may provide twice the modulated output power into the single output bus waveguide 514.

Figure 6A:
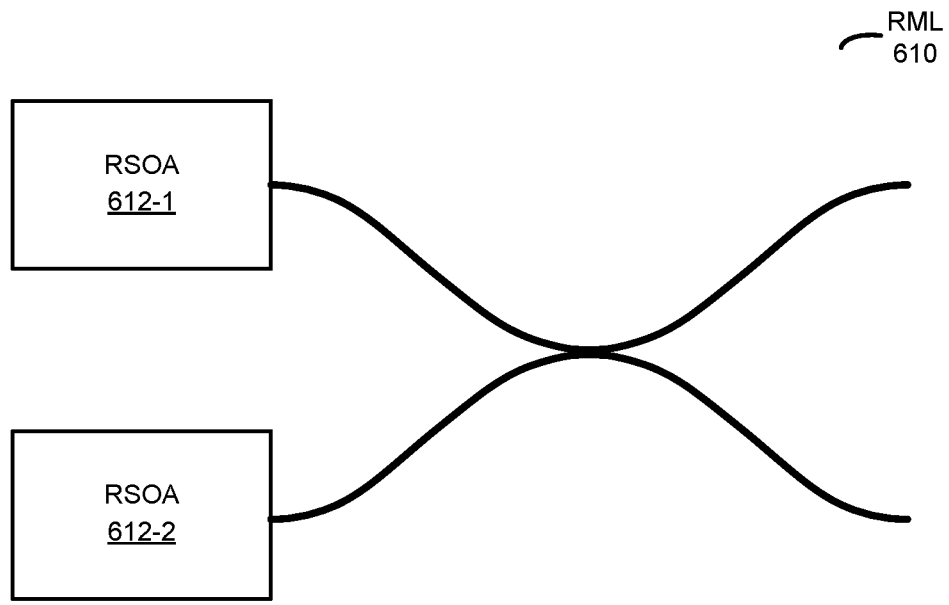
FIG. 6A is a drawing illustrating an example of an RML in accordance with an embodiment of the present disclosure.
Figure 6B:
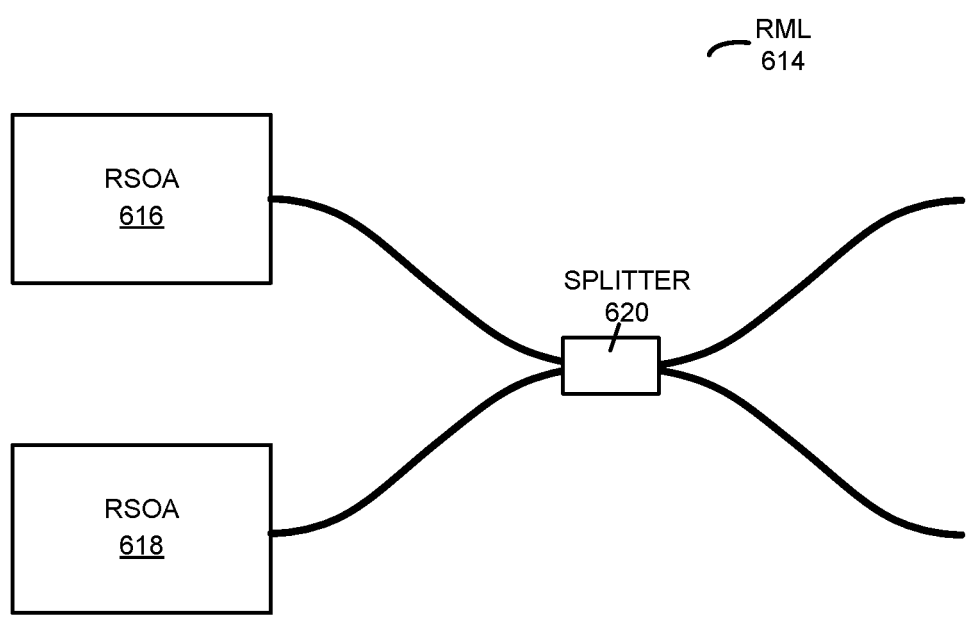
FIG. 6B is a drawing illustrating an example of an RML in accordance with an embodiment of the present disclosure.

Furthermore, in some embodiments a bulk or quantum-well RSOA in the RML is replaced with a quantum-dot material based RSOA, which may enable multiple wavelengths to simultaneously lase without gain competition and which may be independently modulated. This is shown in FIG. 6A, which presents a drawing of an example of a fast-tunable dual RML 610 with RSOAs 612. Moreover, as shown in FIG. 6B, which presents a drawing of an example of a fast-tunable dual RML 614, some embodiments may use a first RSOA 616 and a second independent RSOA 618 gain medium via a splitter 620 (such as a directional coupler) that can be switched on independently of RSOA 616.

A further extension to the use of two RSOAs in an independent lasing condition may include the use of a directional coupler with a 50% power-splitting ratio. This may allow the fast-tunable dual RML to use a second RSOA at the input as a second independent amplifier, which may be switched on separately or concurrent (for simultaneous lasing) and may be modulated with the same external cavity without gain competition. This design may provide multiple benefits. For example, the first RSOA may be switched off and the second RSOA may be switched on to permit the external-cavity fast-tunable RML to lase and to be modulated at a completely different wavelength range (e.g., 1300 nm O-band versus 1550 nm C-band). In a second mode of operation, the RSOAs may have a narrow gain peak less than the FSR of the dual ring resonators, which may be Vernier pairs. Consequently, independently modulated cascaded RMLs can be achieved by modulating the appropriate ring resonators whose resonances lie within the respective gain peaks. In a third mode of operation, a constant current is applied to the first RSOA and data is applied to a corresponding first wavelength via high-speed data modulation by the RML. Simultaneously, the second RSOA can be amplitude modulated via carrier injection at a specified carrier wavelength or at a lower speed than the high-speed RML. This second lasing wavelength may also have the superimposed high-speed data modulation. At the output, wavelength filtering can be used to separate the lasing modes, and subsequently the narrow-band or bandwidth-limited information associated with the second RSOA lasing wavelength can be filtered and discriminated. This may permit a secondary wavelength channel carrying lower bandwidth data at a separate (out-of-band) wavelength, which may be useful in some system applications.

Figure 7:
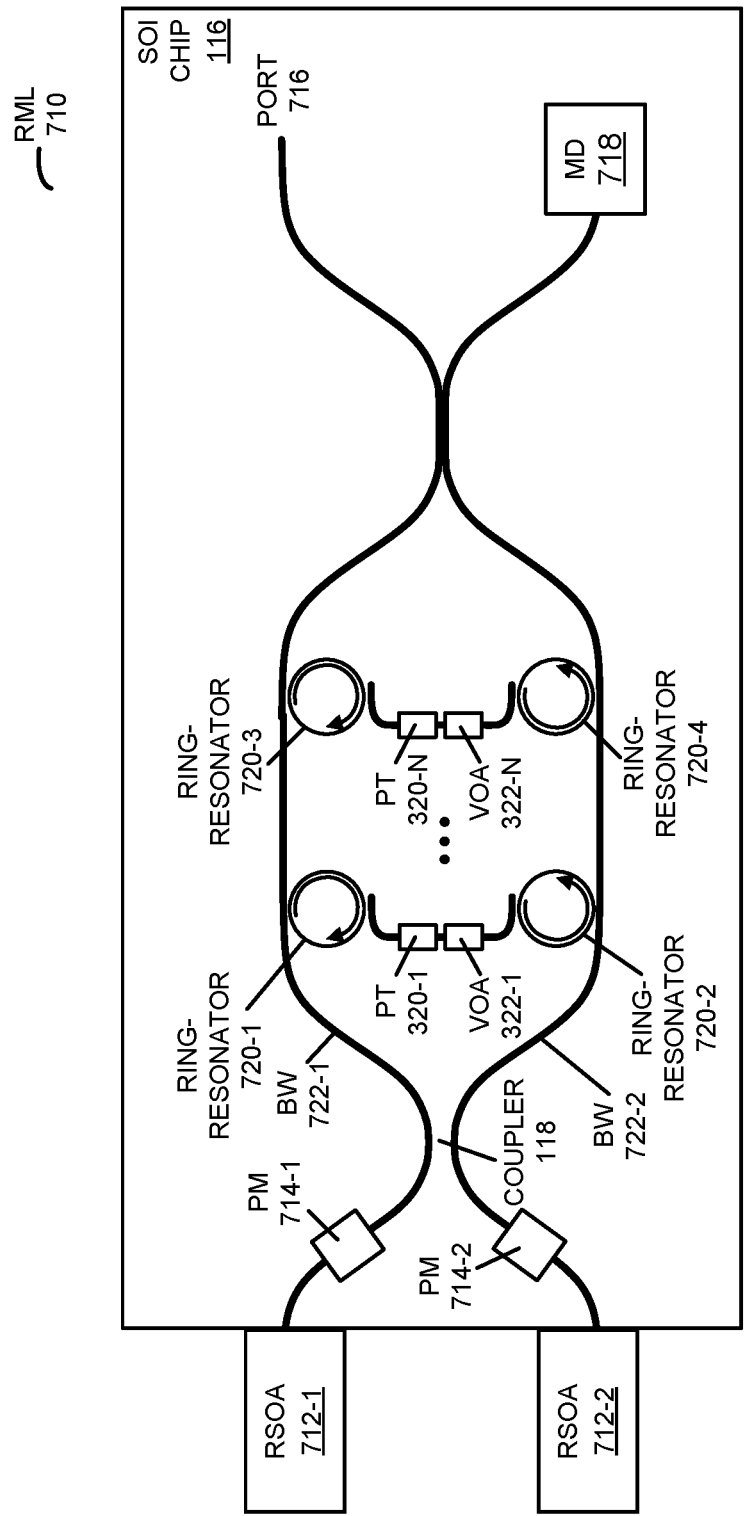
FIG. 7 is a drawing illustrating an example of an RML in accordance with an embodiment of the present disclosure.

FIG. 7 presents a drawing illustrating an example of an RML 710. In this RML, the fast-tunable laser is extended to a hitless fast-tunable laser that guarantees no intermediate wavelength will appear at the output during up-tuning from a first lower wavelength to a second higher wavelength or correspondingly from a third higher wavelength to a fourth lower wavelength. Operation of the hitless laser may proceed as follows. A first one of RSOAs 712 (which may be on the same or different chips, and may produce an optical signal or light having the same or a different fundamental or carrier wavelength) may be phase adjusted through a corresponding one of phase modulators (PMs) 714 so that its outputs (clockwise and counter-clockwise propagating components) appear at output port 716. Meanwhile a second one of RSOAs 712 may be adjusted so that its output is available for monitoring by monitoring device (MD) 718. This lasing output may be fine tuned with the corresponding ring-resonator 720 pairs and may be rapidly tuned (and unquenched) with VOA 322 settings while being monitored. This can be done without presenting any intermediate wavelength to the output port. When needed, the second of RSOAs 712 may be phase adjusted so that it is now available at output port 716, and the first one of RSOAs 712 may be correspondingly and simultaneously tuned to appear at monitoring device 718 for adjustment to a future wavelength as desired. Alternatively, in some embodiments the phase of RSOAs 712 may be adjusted so that the two fundamental or carrier wavelengths from both RSOAs 712 are available at output port 716. Note that ring resonators 720 may be critically coupled to bus waveguides 722.

Note that in RML 710, hitless tuning is used in the rapidly tunable laser. This capability may enable optical switching and other applications in which there is a need to tune the wavelength without causing an intermediate wavelength to appear at output port 716, which may otherwise affect downstream optical components and/or cause wavelength crosstalk. This functionality may be independent of the how rapidly the laser is tuned. The term 'hitless' refers to the fact that the laser has the ability to change from one wavelength to another without hitting any other wavelengths during the transition. In some embodiments, additional monitor ports (not shown) can be used to stabilize the laser. Moreover, ring resonators 720 may be tunable, such as using thermal and/or electro-optic phase tuners. Furthermore, additional phase tuning and laser circuits (not shown) can be included in RML 710.

Thus, the fast-tunable RML may enable an increase of the total tuning range of the laser by using multiple bandgaps. For example, in a slightly modified version of the laser mirror circuit with two RSOA gain chips, each RSOA gain chip may be fabricated with a different bandgap as indicated in the qualitative spectra or resonances in FIG. 2A. Because the bandgaps have a subtle overlap, there exist wavelengths in which the two interwoven cavities can lase at the same wavelength, but only in the middle wavelengths. By sacrificing the redundancy of these shared wavelengths and the ability to make a hitless transition across the entire wavelength range, a total wavelength range can nearly be doubled to, e.g., approximately 80-100 nm. Furthermore, the resonant micro-resonator available in thin SOI platforms may be leveraged in order to enable hitless operation with fine tunability by forming Vernier ring-resonator pairs. This may enhance the tunability of each ring-resonator pair in an RML.

Note that the preceding embodiments may include additional or fewer components. Moreover, positions of one or more components may be changed, two or more components may be combined into a single component and/or a component may be divided into two or more components.

Figure 8:
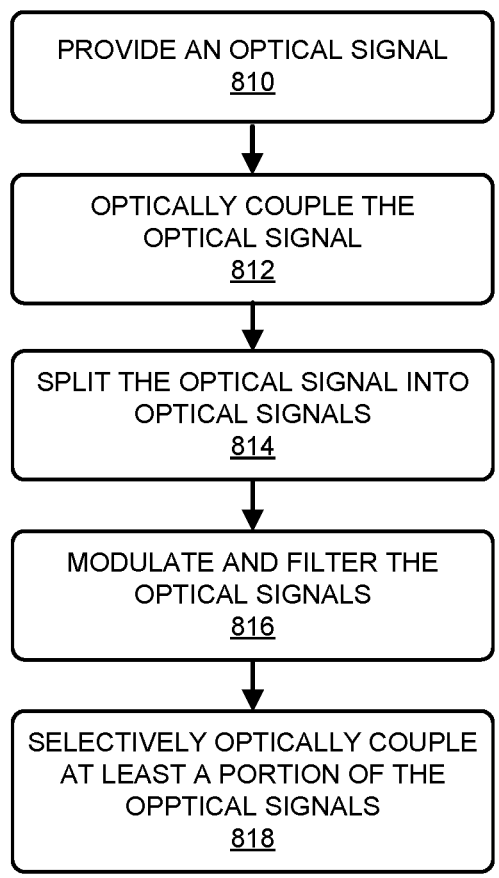
FIG. 8 is a flow diagram illustrating an example of a method for providing an optical signal in accordance with an embodiment of the present disclosure.

We now describe a method. FIG. 8 presents an example of a method 800 for providing an optical signal, which may be performed by an RML (such as one of the RMLs in the preceding embodiments). During operation, an optical gain chip in the RML may provide an optical signal (operation 810). Then, the optical gain chip may optically couple the optical signal (operation 812) to an SOI chip in the RML. Moreover, the SOI chip may split the optical signal into optical signals (operation 814). Next, a first pair of resonators (which may include, without loss of generality, a pair of ring resonators, racetrack resonators, disk resonators and/or resonator filter/modulators) in the SOI chip may modulate and filter the optical signals (operation 816). For example, the filtering may include selective reflecting of the optical signals, such as reflecting one or more wavelengths in the optical signals. Furthermore, the first pair of resonators may selectively optically couple at least a portion of the optical signals to a bus optical waveguide (operation 818) in the RML. For example, the first pair of resonators may selectively couple one or more wavelengths in the optical signals to the bus optical waveguide.

Note that, during operation of the RML, resonance wavelengths of the resonators may be offset from each other with a (e.g., fixed) separation approximately equal or corresponding to a modulation amplitude. Moreover, a reflectivity of the first pair of resonators may be approximately independent of the modulation.

For example, as described previously, an external cavity optical source (such as the RML) may include an optical gain chip (such as a reflective semiconductor optical amplifier) that provides an optical signal and that is optically coupled to an SOI chip. The optical gain chip may include a reflective layer at one end of the optical gain chip. This reflective layer may include a high-reflectivity (HR) coating or a distributed Bragg reflector. Moreover, the SOI chip may include: a common optical waveguide that conveys the optical signal, a splitter that splits the optical signal into optical signals (e.g., into clockwise and counter-clockwise propagating optical signals) that are conveyed on through optical waveguides, a first pair of resonators that are selectively optically coupled to the through optical waveguides and that perform modulation and filtering of the optical signals (e.g., one or more wavelengths in the optical signals may be coupled to the resonators), and a first bus optical waveguide that is selectively optically coupled to the first pair of resonators (e.g., one or more wavelengths in the optical signals may be coupled to the resonators). Note that the reflective layer in the optical gain chip and the first pair of resonators may define a first optical cavity. Furthermore, resonance wavelengths of the resonators may be offset from each other with a (e.g., fixed) separation approximately equal or corresponding to a modulation amplitude, and a reflectivity of the first pair of resonators may be approximately independent of the modulation.

Note that the optical source may be free of phase-induced wavelength chirp or modulation fluctuations. Notably, the optical source may use push-pull modulation of the resonators to interchange positions of the resonance wavelengths during the modulation. The modulation of the resonators may be symmetric so that, at a given time, a first of the resonator provides modulated light while a second of the resonators provides bias and compensates for reflectivity or phase changes. Moreover, a lasing wavelength of the optical source may be offset from the resonance wavelengths. Alternatively, the optical source may use push-push/pull-pull modulation of the resonators, and the lasing wavelength may be approximately midway between the resonance wavelengths.

Moreover, the optical source may include a tuning circuit that thermally or electrically tunes the resonators.

Furthermore, the optical source may include a phase shifter in the optical gain chip, the SOI chip before the splitter, or both that tunes the lasing wavelength.

In some embodiments, the optical source includes a second pair of resonators (which may include, without loss of generality, a pair of ring resonators, racetrack resonators, disk resonators and/or resonator filter/modulators) and an associated second bus waveguide that is selectively optically coupled to the second pair of resonators, where the reflective layer in the optical gain chip and the second pair of resonators defines a second optical cavity. The first bus waveguide and the second bus waveguide may include phase tuners and variable optical attenuators. A given variable optical attenuator may selectively adjust loss in a given optical cavity to select a lasing wavelength of the optical source.

In some embodiments of method 800, there may be additional or fewer operations. Moreover, the order of the operations may be changed, and/or two or more operations may be combined into a single operation.

Figure 9:
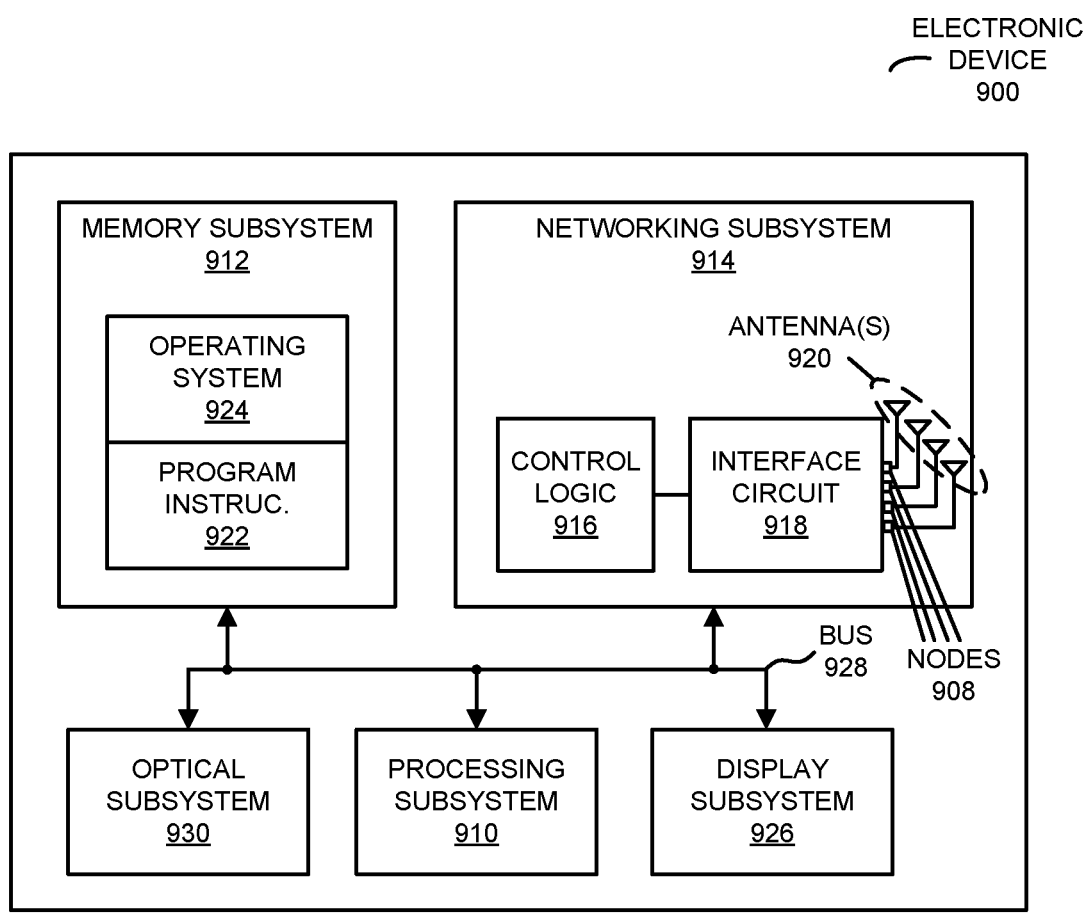
FIG. 9 is a block diagram illustrating an example of an electronic device in accordance with an embodiment of the present disclosure.

We now describe embodiments of an electronic device, which may include an RML. FIG. 9 presents a block diagram illustrating an example of an electronic device 900 (or one or more electronic devices) in accordance with some embodiments. This electronic device includes processing subsystem 910, memory subsystem 912, and networking subsystem 914. Note that one or more of these subsystems may include at least an instance of one of the previous embodiments of the laser. Alternatively or additionally, electronic device 900 may optionally include one or more instances of an RML in another component, such as optional optical subsystem 930.

Processing subsystem 910 includes one or more devices configured to perform computational operations. For example, processing subsystem 910 can include one or more: microprocessors, ASICs, microcontrollers, programmable-logic devices, graphics processing units (GPUs) and/or digital signal processors (DSPs).

Memory subsystem 912 includes one or more devices for storing data and/or instructions for processing subsystem 910 and networking subsystem 914. For example, memory subsystem 912 can include dynamic random access memory (DRAM), static random access memory (SRAM), and/or other types of memory. In some embodiments, instructions for processing subsystem 910 in memory subsystem 912 include: one or more program instructions or sets of instructions (such as program instructions 922 or operating system 924), which may be executed by processing subsystem 910. Note that the one or more computer programs may constitute a computer-program mechanism. Moreover, instructions in the various modules in memory subsystem 912 may be implemented in: a high-level procedural language, an object-oriented programming language, and/or in an assembly or machine language. Furthermore, the programming language may be compiled or interpreted, e.g., configurable or configured (which may be used interchangeably in this discussion), to be executed by processing subsystem 910.

In addition, memory subsystem 912 can include mechanisms (such as a circuit or software) for controlling access to the memory. In some embodiments, memory subsystem 912 includes a memory hierarchy that comprises one or more caches coupled to a memory in electronic device 900. In some of these embodiments, one or more of the caches is located in processing subsystem 910.

In some embodiments, memory subsystem 912 is coupled to one or more high-capacity mass-storage devices (not shown). For example, memory subsystem 912 can be coupled to a magnetic or optical drive, a solid-state drive, or another type of mass-storage device. In these embodiments, memory subsystem 912 can be used by electronic device 900 as fast-access storage for often-used data, while the mass-storage device is used to store less frequently used data.

Networking subsystem 914 includes one or more devices configured to couple to and communicate on an optical, a wired and/or wireless network (e.g., to perform network operations), including: control logic 916, an interface circuit 918 and one or more optional antennas 920 (or antenna elements). (While FIG. 9 includes one or more antennas 920, in some embodiments electronic device 900 includes one or more nodes, such as nodes 908, e.g., a pad, which can be coupled to the one or more antennas 920. Thus, electronic device 900 may or may not include the one or more antennas 920.) For example, networking subsystem 914 can include a Bluetooth™ networking subsystem, a cellular networking subsystem (e.g., a 3G/4G/5G network such as UMTS, LTE, etc.), a universal serial bus (USB) networking subsystem, a networking subsystem based on the standards described in IEEE 802.11 (e.g., a Wi-Fi® networking system), an Ethernet networking subsystem, and/or another networking subsystem.

Networking subsystem 914 includes processors, controllers, radios/antennas, sockets/plugs, and/or other devices used for coupling to, communicating on, and handling data and events for each supported networking system. Note that mechanisms used for coupling to, communicating on, and handling data and events on the network for each network system are sometimes collectively referred to as a 'network interface' for the network system. Moreover, in some embodiments a 'network' or a 'connection' between the electronic devices does not yet exist. Therefore, electronic device 900 may use networking subsystem 914 for performing simple wireless communication, e.g., transmitting advertising or beacon frames and/or scanning for advertising frames transmitted by other electronic devices.

Within electronic device 900, processing subsystem 910, memory subsystem 912, networking subsystem 914 and optional optical subsystem 930 are coupled together using signal lines, links or bus 928. These connections may include an electrical, optical, and/or electro-optical connection that the subsystems can use to communicate signals, commands and data among one another.

Furthermore, while some components are shown directly connected to one another in FIG. 9, in general coupling can also occur via intermediate components. In each instance, the method of interconnection, or 'coupling,' establishes some desired communication between two or more circuit nodes, or terminals. Such coupling may often be accomplished using a number of circuit configurations, as will be understood by those of skill in the art; for example, AC coupling and/or DC coupling may be used. Although only one bus 928 (or one or more signal lines) is shown for clarity in FIG. 9, different embodiments can include a different number or configuration of electrical, optical, and/or electro-optical connections among the subsystems.

In some embodiments, electronic device 900 includes a display subsystem 926 for displaying information on a display, which may include a display driver and the display, such as a liquid-crystal display, a multi-touch touchscreen, etc.

Electronic device 900 and/or an instance of an RML may include or may be included in: a VLSI circuit, a switch, a hub, a bridge, a router, a communication system (such as a wavelength-division-multiplexing communication system), a storage area network, a data center, a network (such as a local area network), and/or a computer system (such as a multiple-core processor computer system). Furthermore, electronic device 900 and/or an instance of an RML may include or may be included in, but is not limited to: a desktop computer, a server (such as a multi-socket, multi-rack server), a laptop computer, a communication device or system, an access point, a router, a switch, communication equipment, a controller, test equipment, a personal computer, a work station, a mainframe computer, a blade, an enterprise computer, a data center, a tablet computer, a supercomputer, a network-attached-storage (NAS) system, a storage-area-network (SAN) system, a media player (such as an MP3 player), an appliance, a subnotebook/netbook, a tablet computer, a smartphone, a cellular telephone, a smartwatch, a network appliance, a set-top box, a personal digital assistant (PDA), a toy, a controller, a digital signal processor, a game console, a device controller, a computational engine within an appliance, a consumer-electronic device, a portable computing device or a portable electronic device, a personal organizer, a sensor (such as a LIDAR sensor), an automobile or a truck, another electronic device, a laser (such as a hybrid laser and/or another optical component).

Although specific components are used to describe electronic device 900, in alternative embodiments, different components and/or subsystems may be present in electronic device 900. For example, electronic device 900 may include one or more additional processing subsystems, memory subsystems, networking subsystems, display subsystems and/or one or more additional subsystems not shown in FIG. 9 (such as a user-input subsystem). Additionally, one or more of the subsystems may not be present in electronic device 900. Also, although separate subsystems are shown in FIG. 9, in some embodiments some or all of a given subsystem or component can be moved or integrated into one or more of the other subsystems or component(s) in electronic device 900. For example, in some embodiments program instructions 922 are included in operating system 924 and/or control logic 916 is included in interface circuit 918. Thus, while electronic device 900, as well as the previous embodiments of the RML, are illustrated as having a number of discrete items, these components are intended to be functional descriptions of the various features that may be present rather than structural schematics of the embodiments described herein.

Moreover, the circuits and components in electronic device 900 may be implemented using any combination of analog and/or digital circuitry, including: bipolar, PMOS and/or NMOS gates or transistors. Furthermore, signals in these embodiments may include digital signals that have approximately discrete values and/or analog signals that have continuous values. Additionally, components and circuits may be single-ended or differential, and power supplies may be unipolar or bipolar.

An integrated circuit (which is sometimes referred to as a 'communication circuit') may implement some or all of the functionality of electronic device 900. In some embodiments, an output of a process for designing the integrated circuit, or a portion of the integrated circuit, which includes one or more of the circuits described herein may be a computer-readable medium such as, for example, a magnetic tape or an optical or magnetic disk. The computer-readable medium may be encoded with data structures or other information describing circuitry that may be physically instantiated as the integrated circuit or the portion of the integrated circuit. Although various formats may be used for such encoding, these data structures are commonly written in: Caltech Intermediate Format (CIF), Calma GDS II Stream Format (GDSII) or Electronic Design Interchange Format (EDIF). Those of skill in the art of integrated circuit design can develop such data structures from schematics of the type detailed above and the corresponding descriptions and encode the data structures on the computer-readable medium. Those of skill in the art of integrated circuit fabrication can use such encoded data to fabricate integrated circuits that include one or more of the circuits described herein.

In some embodiments, the integrated circuit may be implemented using a CMOS technology. Alternatively, the integrated circuit may be implemented using a silicon-on-insulator (SOI) technology or platform. This integrated circuit may include a substrate and a buried-oxide (BOX) layer disposed on the substrate. Moreover, a semiconductor layer may be disposed on BOX layer, where the semiconductor layer, at least in part, includes an optical waveguide. Thus, the substrate may include silicon, the BOX layer may include silicon dioxide, and the semiconductor layer may include silicon. Alternatively, in other embodiments, dielectric optical waveguides are used, i.e. where the starting wafer is a blank silicon wafer with only the lower cladding layer deposited.

However, a wide variety of materials may be used to implement the integrated circuit, the RML, and/or the optical waveguide, including: SOI, a semiconductor (e.g., indium phosphide, aluminum gallium arsenide, aluminum gallium nitride arsenide, aluminum gallium arsenide phosphide, a III-V compound semiconductor, etc.), and/or an insulator optical waveguide (e.g., silicon dioxide or silicon nitride). For example, the RML may include a substrate that is an insulator. Consequently, the semiconductor layer and/or the integrated circuit may include: silicon, silicon dioxide, and/or silicon nitride. Thus, while a silicon was illustrated in the preceding embodiments, the RML may be used or may include with other materials (such as germanium, silicon germanium, another semiconductor, glass and/or plastic), as is known to one of skill in the art. More generally, the RML and/or the integrated circuit may be implemented using a variety of integrated optical waveguide technologies.

In some embodiments, the fundamental or carrier wavelength of an optical signal in the optical waveguide and/or the RML is, e.g., between 1.1-1.7 µm. For example, the optical signal may have a fundamental or a carrier wavelength of 1.3 or 1.55 µm. Moreover, the semiconductor layer may have a thickness that is, e.g., less than 1 µm (such as 0.2-0.5 µm). Furthermore, the semiconductor layer may have a thickness, e.g., of 0.3 µm. Additionally, the BOX layer may have a thickness, e.g., between 0.3 and 3 µm (such as 0.8 µm).

While some of the operations in the preceding embodiments were implemented in hardware or software, in general the operations in the preceding embodiments can be implemented in a wide variety of configurations and architectures, such as by one or more: ASICs, FPGAs, DPSs, GPUs, etc. Therefore, some or all of the operations in the preceding embodiments may be performed in hardware, in software or both. For example, at least some of the operations in the communication technique may be implemented using program instructions 922, operating system 924 (such as a driver for interface circuit 918) or in firmware in interface circuit 918 or optional optical subsystem 930. Alternatively or additionally, at least some of the operations in the communication technique may be implemented in a physical layer, such as hardware in interface circuit 918 or optional optical subsystem 930. In general, electronic device 900 may be at one location or may be distributed over multiple, geographically dispersed locations.

Moreover, the preceding embodiments of the RML and/or electronic device 900 can be used in a wide variety of applications, such as: communications (for example, in a transceiver, an optical source (such as a laser), an optical interconnect or an optical link, such as for intra-chip or inter-chip communication), a radio-frequency filter, a biosensor, data storage (such as an optical-storage device or system), medicine (such as a diagnostic technique or surgery), a barcode scanner, metrology (such as precision measurements of distance), manufacturing (cutting or welding), a lithographic process, data storage (such as an optical-storage device or system) and/or entertainment (a laser light show).

While the preceding embodiments have been illustrated with particular elements and compounds, a wide variety of materials and compositions (including stoichiometric and non-stoichiometric compositions) may be used, as is known to one of skill in the art. Furthermore, the materials and compounds in the embodiments of the RML and/or optional optical subsystem 930 may be fabricated using a wide variety of processing techniques, including: evaporation, sputtering, chemical vapor deposition, molecular-beam epitaxy, wet or dry etching (such as photolithography or direct-write lithography), polishing, etc. In addition, a wide variety of optical components may be used in or in conjunction with one or more of the embodiments of the RML and/or optional optical subsystem 930. Furthermore, a wide variety of optical sources may be integrated with or included in one or more of the embodiments of the RML and/or optional optical subsystem 930, including many different types of lasers (lasers that are fabricated using materials other than III-V semiconductors) or non-laser optical sources (such as a light-emitting diode).

Moreover, while the preceding discussion included some numerical values, these values are for purposes of illustration and are not intended to be limiting. In other embodiments, different numerical values may be used.

In the preceding description, we refer to 'some embodiments.' Note that 'some embodiments' describes a subset of all of the possible embodiments, but does not always specify the same subset of embodiments.

The foregoing description is intended to enable any person skilled in the art to make and use the disclosure, and is provided in the context of a particular application and its requirements. Moreover, the foregoing descriptions of embodiments of the present disclosure have been presented for purposes of illustration and description only. They are not intended to be exhaustive or to limit the present disclosure to the forms disclosed. Accordingly, many modifications and variations will be apparent to practitioners skilled in the art, and the general principles defined herein may be applied to other embodiments and applications without departing from the spirit and scope of the present disclosure. Additionally, the discussion of the preceding embodiments is not intended to limit the present disclosure. Thus, the present disclosure is not intended to be limited to the embodiments shown, but is to be accorded the widest scope consistent with the principles and features disclosed herein.

What is claimed is:

1. An optical source, comprising:
   an optical gain chip configured to provides an optical signal, wherein the optical gain chip comprises a reflective layer at one end of the optical gain chip; and
   a silicon-on-insulator (SOI) chip optically coupled to the optical gain chip, wherein the SOI chip comprises:
   a common optical waveguide configured to convey the optical signal;
   a splitter, optically coupled to the common optical waveguide, configured to split the optical signal into optical signals on through optical waveguides;
   a first pair of resonators selectively optically coupled to the through optical waveguides, wherein the resonators are configured to perform modulation and filtering of the optical signals;
   a first bus optical waveguide selectively optically coupled to the first pair of resonators, wherein the reflective layer in the optical gain chip and the first pair of resonators defines a first optical cavity,
   wherein the optical source is configured to have resonance wavelengths of the resonators offset from each other with a separation approximately equal to a modulation amplitude, and
   wherein the optical source is configured to have a reflectivity of the first pair of resonators that is approximately independent of the modulation; and a second pair of resonators and an associated second bus waveguide that is selectively optically coupled to the second pair of resonators, wherein the reflective layer in the optical gain chip and the second pair of resonators defines a second optical cavity;

wherein the first bus waveguide and the second bus waveguide comprise phase tuners and variable optical attenuators; and wherein a given variable optical attenuator is configured to selectively adjust loss in a given optical cavity to select a lasing wavelength of the optical source.

2. The optical source of claim 1, wherein the optical source is free of phase-induced wavelength chirp or modulation fluctuations.

3. The optical source of claim 1, wherein the optical gain chip comprises a reflective semiconductor optical amplifier.

4. The optical source of claim 1, wherein the optical source comprises a tuning circuit configured to thermally or electrically tune the resonators.

5. The optical source of claim 1, wherein the optical source is configured to use approximately the same modulation magnitude with alternating and opposite signs on the resonators to interchange positions of the resonance wavelengths during the modulation.

6. The optical source of claim 1, wherein the optical source comprises a phase shifter in the optical gain chip, the SOI chip before the splitter, or both; and wherein the phase shifter is configured to tune a lasing wavelength of the optical source.

7. The optical source of claim 1, wherein a lasing wavelength of the optical source is offset from the resonance wavelengths.

8. The optical source of claim 1, wherein the modulation of the resonators is symmetric so that, at a given time, a first of the resonator provides modulated light while a second of the resonators provides bias and compensates for reflectivity or phase changes.

9. The optical source of claim 1, wherein the optical source is configured to use approximately the same modulation magnitudes with the same alternating signs on the resonators during the modulation; and wherein a lasing wavelength of the optical source is approximately midway between the resonance wavelengths.

10. An electronic device, comprising an optical source, wherein the optical source comprises:

an optical gain chip configured to provides an optical signal, wherein the optical gain chip comprises a reflective layer at one end of the optical gain chip; and a silicon-on-insulator (SOI) chip optically coupled to the optical gain chip, wherein the SOI chip comprises:

a common optical waveguide configured to convey the optical signal;

a splitter, optically coupled to the common optical waveguide, configured to split the optical signal into optical signals on through optical waveguides;

a first pair of resonators selectively optically coupled to the through optical waveguides, wherein the resonators are configured to perform modulation and filtering of the optical signals;

a first bus optical waveguide selectively optically coupled to the first pair of resonators, wherein the reflective layer in the optical gain chip and the first pair of resonators defines a first optical cavity, wherein the optical source is configured to have resonance wavelengths of the resonators offset from each other with a separation approximately equal to a modulation amplitude, and wherein the optical source is configured to have a reflectivity of the first pair of resonators that is approximately independent of the modulation; and a second pair of resonators and an associated second bus waveguide that is selectively optically coupled to the second pair of resonators, wherein the reflective layer in the optical gain chip and the second pair of resonators defines a second optical cavity, wherein the first bus waveguide and the second bus waveguide comprise phase tuners and variable optical attenuators; and wherein a given variable optical attenuator is configured to selectively adjust loss in a given optical cavity to select a lasing wavelength of the optical source.

11. The electronic device of claim 10, wherein the optical source is free of phase-induced wavelength chirp or modulation fluctuations.

12. The electronic device of claim 10, wherein the optical gain chip comprises a reflective semiconductor optical amplifier.

13. The electronic device of claim 10, wherein the optical source comprises a tuning circuit configured to thermally or electrically tune the resonators.

14. The electronic device of claim 10, wherein the optical source is configured to use approximately the same modulation magnitude with alternating and opposite signs on the resonators to interchange positions of the resonance wavelengths during the modulation.

15. The electronic device of claim 10, wherein the optical source comprises a phase shifter in the optical gain chip, the SOI chip before the splitter, or both; and wherein the phase shifter is configured to tune a lasing wavelength of the optical source.

16. The electronic device of claim 10, wherein a lasing wavelength of the optical source is offset from the resonance wavelengths.

17. The electronic device of claim 10, wherein the modulation of the resonators is symmetric so that, at a given time, a first of the resonator provides modulated light while a second of the resonators provides bias and compensates for reflectivity or phase changes.

18. The electronic device of claim 10, wherein the optical source is configured to use approximately the same modulation magnitudes with the same alternating signs on the resonators during the modulation; and wherein a lasing wavelength of the optical source is approximately midway between the resonance wavelengths.

19. A method for providing an optical signal, comprising:
by an optical source:
providing an optical signal using an optical gain chip;
optically coupling the optical signal to a silicon-on-insulator (SOI) chip;
splitting the optical signal into optical signals and second optical signals;
modulating and filtering the optical signals using a first pair of resonators, wherein a reflective layer in the optical gain chip and the first pair of resonators defines a first optical cavity;
selectively coupling a portion of the optical signals to a bus optical waveguide, wherein resonance wavelengths of the resonators are offset from each other with a separation approximately equal to a modulation amplitude, and wherein a reflectivity of the first pair of resonators is approximately independent of the modulation;

modulating and filtering the second optical signals using a second pair of resonators, wherein the reflective layer in the optical gain chip and the second pair of resonators defines a second optical cavity; and selectively coupling a portion of the second optical signals to a second bus optical waveguide, wherein the first bus waveguide and the second bus waveguide comprise phase tuners and variable optical attenuators; and wherein a given variable optical attenuator is configured to selectively adjust loss in a given optical cavity to select a lasing wavelength of the optical source.

20. The method of claim 19, wherein the optical source uses approximately the same modulation magnitude with alternating and opposite signs on the first pair of resonators or the second pair of resonators to interchange positions of the resonance wavelengths during the modulation.

\* \* \* \* \*